(12) United States Patent
Nakamura et al.

(10) Patent No.: US 6,362,084 B1
(45) Date of Patent: Mar. 26, 2002

(54) METHOD OF MANUFACTURING A SUBSTRATE FOR DISPLAYS AND A SUBSTRATE FOR DISPLAYS MANUFACTURED BY SAME

(75) Inventors: Maki Nakamura; Toshiaki Mizuno; Etsuo Ogino; Toshiaki Anzaki, all of Osaka (JP)

(73) Assignee: Nippon Sheet Glass Co, Ltd. (JP)

( * ) Notice: Subject to any disclaimer, the term of this patent is extended or adjusted under 35 U.S.C. 154(b) by 0 days.

(21) Appl. No.: 09/619,329

(22) Filed: Jul. 20, 2000

(30) Foreign Application Priority Data

Jul. 23, 1999 (JP) .......................... 11-209178

(51) Int. Cl.[7] .............................................. H01L 21/20
(52) U.S. Cl. ...................................... 438/584; 347/203
(58) Field of Search ..................... 347/203; 349/137; 428/698, 699, 701, 703, 446; 438/584

(56) References Cited

U.S. PATENT DOCUMENTS

| | | | |
|---|---|---|---|
| 4,708,915 A | * 11/1987 | Ogawa et al. | 428/698 |
| 4,954,744 A | 9/1990 | Suzuki et al. | 313/336 |
| 5,557,313 A | * 9/1996 | Nakayama et al. | 347/203 |
| 6,014,196 A | * 1/2000 | Anzaki et al. | 349/137 |
| 6,046,758 A | * 4/2000 | Brown et al. | 347/203 |

FOREIGN PATENT DOCUMENTS

| | | |
|---|---|---|
| EP | 0 913 367 A1 | 5/1999 |
| JP | 0 6346076 | 12/1994 |
| JP | 0 8162001 | 6/1996 |

OTHER PUBLICATIONS

"A novel lithium conductor prepared by unbalanced magnetron r.f. sputtering"; L. Nguyen et al.; Thin Solid Films, CH, Elsevier Science S.A. Lausanne; vol. 293: No. 1–2; Jan. 30, 1997; pp. 175–178; XP004080853 ISSN: 0040–6090.

* cited by examiner

Primary Examiner—David Nelms
Assistant Examiner—David Vu
(74) Attorney, Agent, or Firm—Rossi & Associates

(57) ABSTRACT

A method of manufacturing a substrate for displays is provided, which can easily control the surface electrical resistance of the anti-electrification film formed on a surface of the substrate, and a substrate for displays manufactured by the same method. The film is formed by preparing a target from a metal oxide, and forming a thin film of a metal oxynitride on a surface of the substrate by sputtering using the target in an atmosphere of a mixture gas of an inert gas and nitrogen, a mixing ratio of the inert gas and nitrogen in the atmosphere being adjusted such that the thin film has a desired surface electrical resistance.

44 Claims, 5 Drawing Sheets

METHOD OF MANUFACTURING A SUBSTRATE FOR DISPLAYS AND A SUBSTRATE FOR DISPLAYS MANUFACTURED BY SAME

BACKGROUND OF THE INVENTION

1. Field of the Invention

The present invention relates to a method of manufacturing a substrate for displays and a substrate for displays manufactured by the same method, and more particularly, to a method of manufacturing a substrate for displays, which has a film formed thereon to prevent electrification of the substrate surface, and a substrate for displays manufactured by the same method.

2. Prior Art

Conventional substrates for displays for use in field emission displays (FED) including surface-conduction electron-emitter devices (SED), and plasma display panels (PDP) had the disadvantage that the substrate surface is prone to electrification attributable to the driving method of the FED or PDP, i.e., due to application of a high electric field between the substrates for generation of light or due to exposure of the surface of the substrate to plasma. The electrification can cause generation of a spark, leading to a shortened service life of a display element. The electrification of the substrate surface depends on the surface electrical resistance of the substrate.

To prevent the shortening of the life of the display element caused by electrification of the substrate surface, it has been proposed to form, on a surface of the substrate, a thin film of a metal oxynitride having a surface electrical resistance controlled to a desired value suitable for anti-electrification. The formation of the thin film of the metal oxynitride on the surface of the substrate is performed by sputtering using a metal target in a mixture gas atmosphere of oxygen and nitrogen. The surface electrical resistance of the thin film is controlled to a desired value by changing the mixing ratio of oxygen and nitrogen in the mixture gas atmosphere.

According to the conventional anti-electrification method, however, it was difficult to control the surface electrical resistance to a desired value because when the ratio of oxygen and nitrogen in the mixture gas atmosphere is changed during sputtering using the metal target, the surface electrical resistance of the thin film to be formed on the surface of the substrate changes drastically even with a small change in the mixing ratio of oxygen and nitrogen.

SUMMARY OF THE INVENTION

It is therefore an object of the present invention to provide a method of manufacturing a substrate for displays, which can easily control the surface electrical resistance of the anti-electrification film formed on a surface of the substrate, and a substrate for displays manufactured by the same method.

To attain the above object, the present invention provides a method of manufacturing a substrate for displays, comprising the steps of preparing a target from a metal oxide, and forming a thin film of a metal oxynitride on a surface of the substrate by sputtering using the target in an atmosphere of a mixture gas of an inert gas and nitrogen, a mixing ratio of the inert gas and nitrogen in the atmosphere being adjusted such that the thin film has a desired surface electrical resistance.

According to the method of the present invention, it is possible to easily control the value of the surface electrical resistance of the anti-electrification thin film formed on the surface of the substrate to a desired value.

Preferably, the inert gas is contained in the atmosphere in an amount of 5 to 95 volume %.

As a result, it is possible to form an anti-electrification thin film of metal oxynitride on the surface of the substrate in a reliable and a highly reproducible manner, thereby making it possible to positively control the value of the surface electrical resistance of the thin film to a desired value.

Preferably, the desired surface electrical resistance is $1.0 \times 10^8$ to $1.0 \times 10^{12}$ $\Omega/\square$.

As a result, electric charges of the surface of the substrate can be dissipated, thereby making it possible to suppress the shortening of the life of the display element due to electrification of the substrate surface, that is, the element can fully withstand practical use.

In a preferred form of the present invention, the target is formed of at least two kinds of metal oxides.

As a result, it is possible to control the surface electrical resistance value of the thin film to a desired value in a more reliable manner.

Preferably, one kind of the two kinds of metal oxides is an oxide of an element selected from the group consisting of titanium and zirconium.

Preferably, the other kind of the two kinds of metal oxides is an oxide of an element selected from the group consisting of niobium, vanadium, tantalum, yttrium, and tungsten.

Preferably, one kind of the two kinds of metal oxides is contained in the target in an amount of 70 to 99.5 weight %.

Still preferably, the other kind of the two kinds of metal oxides is contained in the target in an amount of 0.5 to 30 weight %.

As a result, it is possible to control the surface electrical resistance of the thin film in a more reliable manner.

In another preferred form of the present invention, the method of manufacturing a substrate for displays further comprises the step of forming at least one anti-movable ion thermodiffusion film stacked on the thin film formed on the surface of the substrate.

As a result, it is possible to prevent electrification of the substrate surface, as well as prevent abnormal operation of the display element due to thermodiffusion of movable ions.

Preferably, the anti-movable ion thermodiffusion film is formed of a compound selected from the group consisting of an oxide of silicon, an oxynitride of silicon, or a nitride of silicon.

As a result, it is possible to positively prevent abnormal operation of the display element due to thermodiffusion of movable ions.

Preferably, the anti-movable ion thermodiffusion film has a total film thickness of 20 to 1000 nm.

As a result, it is possible to effectively prevent abnormal operation of the display element due to thermodiffusion of movable ions.

Further, the present invention provides a substrate for displays manufactured by preparing a target from a metal oxide, and forming a thin film of a metal oxynitride on a surface of the substrate by sputtering using the target in an atmosphere of a mixture gas of an inert gas and nitrogen, a mixing ratio of said inert gas and nitrogen in said atmosphere being adjusted such that said thin film has a desired surface electrical resistance.

According to the substrate for displays of the present invention, no electrification of the substrate surface can occur, making it possible to obtain a substrate for displays at a low cost without shortening of the life of the display element.

The above and other objects, features and advantages of the invention will become more apparent from the following detailed description taken in conjunction with the accompanying drawings.

DETAILED DESCRIPTION

The present invention will now be described in detail with reference to the drawings showing a preferred embodiment thereof.

To attain the object, the present inventors conducted extensive studies on a method of manufacturing a substrate for displays, which includes forming a thin film of a metal oxynitride having a desired surface electrical resistance on a surface of the substrate by sputtering using a target in a gas atmosphere containing nitrogen. As a result, the inventors reached a finding that if the target is formed of a metal oxide, the gas atmosphere is formed of a mixture of an inert gas and nitrogen, and the mixing ratio of the inert gas and oxygen of the gas atmosphere is adjusted such that the thin film has a desired surface electrical resistance, the change of the surface electrical resistance of the anti-electrification thin film becomes moderate relative to the change in the mixing ratio of the inert gas and nitrogen, thus making it possible to easily control the surface electrical resistance of the thin film to a desired value Further, it was found that preferably, if the content of the inert gas in the gas atmosphere is 5 to 95 volume %, it is possible to form the thin film of a metal oxynitride on the surface of the substrate in a reliable manner.

Further, the present inventors also found that if the target is formed of at least two kinds of metal oxides, one of which is a metal oxide of either titanium or zirconium, and the other is a metal oxide of one of niobium, vanadium, tantalum, yttrium, and tungsten, and if the content of the former metal oxide is 70 to 99.5 weight %, and the content of the latter metal oxide is 0.5 to 30 weight %, then it is possible to control the value of the surface electrical resistance to a desired value in a more reliable manner.

In particular, if the thin film is formed on the surface of the substrate by sputtering using a titanium oxide-based target containing 0.5 to 30 weight % of niobium in an atmosphere of an argon and nitrogen mixture gas, it is possible to control the value of the surface electrical resistance in an especially reliable manner. In this case, if the niobium oxide content is less than 0.5 weight %, a stable electric discharge cannot be conducted during sputtering. On the other hand, even if the niobium oxide content is above 30 weight %, the electric conductivity of the target does not change significantly.

The present invention is based upon the above findings.

Figure 1:
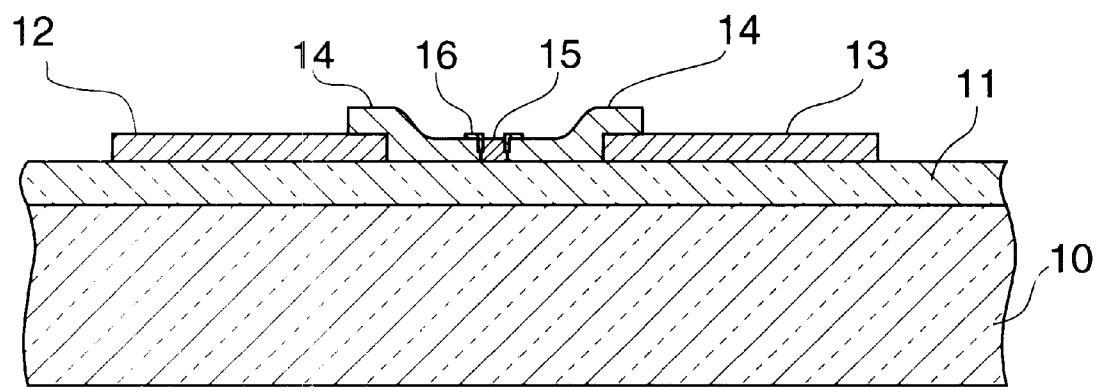
FIG. 1 is a sectional view of a flat-type surface-conduction electron-emitter device with a substrate for a display according to an embodiment of the present invention.

The structure of a flat-type surface-conduction electron-emitter device (field emission element) with a substrate for a display according to an embodiment of the present invention will now be described in detail with reference to FIG. 1. FIG. 1 is a sectional view of the field emission element.

In FIG. 1, numeral 10 designates a glass substrate which has an element-formed surface on which a thin film 11 is formed by sputtering, to prevent electrification of the surface of the glass substrate 10. The substrate 10 is formed of soda-lime glass, and has a thickness of, for example, 3 mm. The thin film 11 has a thickness of, for example, 10 nm.

A pair of element electrodes 12 and 13, which are formed of a conductive material, are formed on the thin film 11. The element electrodes 12 and 13 may be formed by a combination of a film forming technique such as CVD and a patterning technique such as photolithography and etching, or may be formed by a printing technique.

The shape of the element electrodes 12 and 13 is designed according to the application of the field emission element.

A conductive film 14 is formed between the element electrodes 12 and 13, by means of photolithography or etching. The conductive film 14 and the element electrodes 12 and 13 partially overlap with each other so that they are preferably electrically well connected to each other. An electron emitting part 15 having a higher electrical resistance than the conductive film 14 is formed in a part of the conductive film 14, by an electroforming method.

The electron emitting part 15 and its neighboring area are coated with a thin film 16. The thin film 16, which is formed of carbon or a carbon compound, is formed after the formation of the electron emitting part 15, by an electric activation method.

The thin film 11 is formed of at least two kinds of metal oxynitrides, one of which is a metal oxynitride of either titanium or zirconium (TiON, ZrON), and the other is a metal oxynitride of one of niobium, vanadium, tantalum, yttrium, and tungsten (NbON, VaON, TaON, YON, or WON). "ON" in the terms TiON and such does not mean a stoichiometric representation, but simply implies that both of oxygen and nitrogen are contained. The same applies to the term "ON" mentioned hereinafter.

The formation of the thin film 11 on the surface of the substrate 10 by sputtering is carried out using a metal oxide target in a gas atmosphere of a mixture of an inert gas and nitrogen, while the mixing ratio of the inert gas and nitrogen in the gas atmosphere is adjusted such that the thin film 14 exhibits a desired surface electrical resistance.

It is preferable that the surface electrical resistance of the thin film 11 is in a range of $1.0 \times 10^8$ to $1.0 \times 10^{12}$ $\Omega/\square$. This range allows electric charges of the substrate surface to be dissipated, so that the shortening of the life of the display element due to the electrification of the substrate surface can be suppressed. That is, the display element can fully withstand practical use.

It is preferable that the surface electrical resistance of the metal oxide target is 10 $\Omega/\square$ or less. This enables the formation of the thin film 11 to be controlled in a reliable manner.

Figure 2:
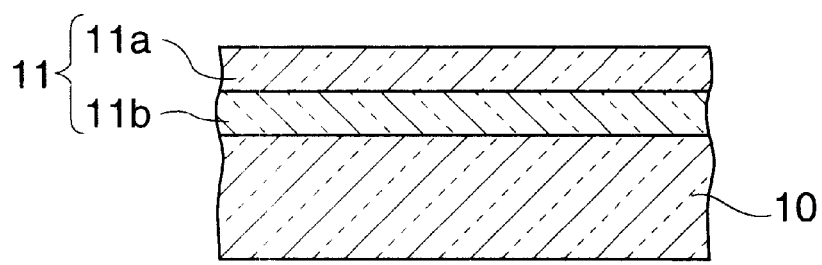
FIG. 2 is a sectional view of a thin film 11 appearing in FIG. 1.

Further, as shown in FIG. 2, the thin film 11 may be formed by stacking at least one alkali-ion passivation film 11b (anti-movable ion thermodiffusion film) containing a compound selected from the group consisting of $SiO_2$ an oxynitride of silicon (SiON), and a nitride of silicon, on the above described thin film 11a formed of at least two kinds of the metal oxynitrides. This prevents not only electrification of the surface of the substrate but also abnormal operation of the display element due to alkali-ion thermodiffusion.

It is preferable that the total film thickness of the at least one alkali-ion passivation film 11b is 20 to 1000 nm. If the total film thickness is less than 20 nm, it is not possible to prevent abnormal operation of the display element due to alkali-ion thermodiffusion, while if the total film thickness is more than 1000 nm, the effect of preventing alkali-ion thermodiffusion is not significantly improved.

In the thin film 11, the stacking order of the at least two layers 11a and 11b can be selected as desired.

EXAMPLES

The following experiments were conducted in order to confirm the above described findings of the present invention.

First, substrates 10 constructed as above were prepared from a soda-lime glass material having a thickness of 3 mm (consisting essentially of 72 weight % of $SiO_2$, 13 weight % of $Na_2O$, 8 weight % of CaO, 4 weight % of MgO, 1.8 weight % of $Al_2O_3$ and 0.9 weight % of $K_2O$ ). Then, thin films 11 were formed on surfaces of the substrates 10 by sputtering, using targets and mixture gas atmospheres shown in Table 1.

The obtained $Nb_2O_5$—$TiO_2$ target showed a relative density of 96% or more as a result of measurement according to Archimedes Method, and showed a surface electrical resistance of approximately 2 $\Omega/\square$ as a result of measurement according to the four terminal method.

Next, the method of forming the thin film 11 of Example 1 by sputtering will be described.

The $Nb_2O_5$—$TiO_2$ target prepared as above was set in an in-line type sputtering apparatus comprised of a preliminary evacuation chamber and a sputter chamber. The sputter chamber was evacuated to $5.0 \times 10^{-4}$ Pa or less by a rotary pump and a cryopump. Then, a substrate 10, which was cleaned in advance and had a thickness of 3 mm, was inserted into the preliminary evacuation chamber, followed by evacuating the chamber to 0.3 Pa or less. Then, the substrate 10 was moved into the sputter chamber, and an

TABLE 1

| | | | EXAMPLE ACCORDING TO PRESENT INVENTION | COMPARATIVE EXAMPLES | |
|---|---|---|---|---|---|
| | TARGET | | 1 $Nb_2O_5$—$TiO_2$ SURFACE ELECTRICAL | 1 $Nb_2O_5$—$TiO_2$ SURFACE ELECTRICAL | 2 Ti SURFACE ELECTRICAL |
| GAS FLOW RATE A (SCCM) | GAS FLOW RATE B (SCCM) | GAS FLOW RATE RATIO A/(A + B) | RESISTANCE ($\Omega/\square$) A: Ar, B: $N_2$ | RESISTANCE ($\Omega/\square$) A: Ar, B: $O_2$ | RESISTANCE ($\Omega/\square$) A: $N_2$, B: $O_2$ |
| 0 | 50 | 0.00 | $3.80 \times 10^7$ | $6.00 \times 10^{16}$ | $6.30 \times 10^{16}$ |
| 2.5 | 47.5 | 0.05 | $1.49 \times 10^9$ | $5.50 \times 10^{16}$ | $5.85 \times 10^{16}$ |
| 10 | 40 | 0.20 | $2.94 \times 10^9$ | $5.00 \times 10^{16}$ | $5.40 \times 10^{16}$ |
| 20 | 30 | 0.40 | $1.66 \times 10^{10}$ | $2.00 \times 10^{16}$ | $3.00 \times 10^{16}$ |
| 25 | 25 | 0.50 | $7.65 \times 10^9$ | $1.00 \times 10^{16}$ | $2.30 \times 10^{16}$ |
| 30 | 20 | 0.60 | $1.00 \times 10^9$ | $9.00 \times 10^{15}$ | $2.00 \times 10^{16}$ |
| 40 | 10 | 0.80 | $5.00 \times 10^8$ | $6.88 \times 10^{15}$ | $6.00 \times 10^{15}$ |
| 47.5 | 2.5 | 0.95 | $2.54 \times 10^8$ | $3.44 \times 10^{15}$ | $3.00 \times 10^{15}$ |
| 50 | 0 | 1.00 | $8.00 \times 10^6$ | $8.00 \times 10^6$ | $2.00 \times 10^5$ |

Table 1 contains Example 1 in which sputtering was conducted using a $Nb_2O_5$—$TiO_2$ target (the $Nb_2O_5$ content is 2.5 weight %) in an argon-nitrogen mixture gas atmosphere, Comparative Example 1 in which sputtering was conducted using a $Nb_2O_5$—$TiO_2$ target in an argon-oxygen mixture gas atmosphere, and Comparative Example 2 in which sputtering was conducted using a Ti target in a nitrogen-oxygen mixture gas atmosphere. In each example, the flow rate ratio (A/(A+B)) of a first gas component flow rate A was varied from 0 to 100% (that is, (B/(A+B)) of the other gas component flow rate B was varied from 100 to 0%).

The method of preparing one of the above targets will be explained with reference to the $Nb_2O_5$—$TiO_2$ target as an example. The other targets were prepared in similar manners.

First, a fine powder of 97.5 weight % of titanium oxide ($TiO_2$) and a fine powder of 2.5 weight % niobium oxide ($Nb_2O_5$) were thoroughly mixed. Then, 2 weight % of an organic binder was added to the $TiO_2$ and $Nb_2O_5$ mixture, followed by agitating in a vibrating mill for 2 hours. Then, water was added to the resulting mixture to granulate the same, followed by conducting cold hydrostatic molding under a pressure of 3.5 ton/cm². The resulting molded piece was then heated to 400° C. to degrease the same, followed by presintering in an oxygen atmosphere at 1400° C. for 5 hours. Further, the presintered piece was charged into a crucible, which was then sealed. The presintered piece in the crucible was subjected to hot isotropic press working in an argon atmosphere containing a slight amount of oxygen gas, at 1350° C. and under a pressure of 50 MPa, thereby preparing a $Nb_2O_5$—$TiO_2$ sintered body target.

argon gas was introduced into the chamber at a rate of 50 cm³/min. (standard cubic centimeters per minute) (hereinafter referred to as "SCCM"), to adjust the pressure to 0.3 Pa. Then, electric power was supplied from a direct current source to a cathode holding the target to cause an electric discharge of the target, while the substrate 10 was passed over the target, to form a thin film 11 of a mixture of titanium oxide and niobium oxide having a thickness of 10 nm on a surface of the substrate 10. The surface electrical resistance of the thin film 11 was $8.00 \times 10^6$ $\Omega/\square$.

Further, a thin film 11 of a mixture of titanium oxynitride and niobium oxynitride having a thickness of 10 nm was formed in the same manner as above, by introducing argon gas at 47.5 SCCM and nitrogen gas at 2.5 SCCM into the sputter chamber to adjust the pressure to 0.3 Pa. The surface electrical resistance of this thin film 11 was $2.54 \times 10^8$ $\Omega/\square$.

In the same manner, thin films 11 having a thickness of 10 nm were formed on surfaces of the substrates 10 as Example 1 and Comparative Example 1, according to various gas flow rate ratios indicated in Table 1, and the surface electrical resistance of each example was measured (however, for Comparative Example 1, argon gas and oxygen gas were introduced as components of the atmosphere gas, according to gas flow rate ratios indicated in Table 1).

Next, the method of forming the thin film 11 of Comparative Example 2 by sputtering will be described.

A thin film 11 was formed by using a Ti target and an in-line type sputtering apparatus comprised of a preliminary evacuation chamber and a sputter chamber. More specifically, a metal titanium target was set in the sputter chamber, and then the sputter chamber was evacuated to $5.0×10^{-4}$ Pa or less by a rotary pump and a cryopump. Then, a substrate 10 with a thickness of 3 mm, which was cleaned in advance, was inserted into the preliminary evacuation chamber and the chamber was evacuated to 0.3 Pa or less. Next, the substrate 10 was moved into the sputter chamber, into which a nitrogen gas was introduced at a rate of 50 SCCM to adjust the pressure to 0.3 Pa. Then, electric power was supplied from a direct current source to a cathode holding the Ti target to cause an electric discharge of the Ti target, while the substrate 10 was passed over the target, to form a thin film 11 of titanium oxynitride having a thickness of 10 nm on a surface of the substrate 10. The surface electrical resistance of this thin film 11 was $2.0×10^5$ $\Omega/\square$.

Further, a thin film 11 of titanium oxynitride having a thickness of 10 nm was formed in the same manner as above, by introducing nitrogen gas at 47.5 SCCM and oxygen gas at 2.5 SCCM into the sputter chamber to adjust the pressure to 0.3 Pa. The surface electrical resistance of this thin film 11 was $3.0×10^{15}$ $\Omega/\square$.

In the same manner, thin films 11 having a thickness of 10 nm were formed on surfaces of substrates 10, according to gas flow rate ratios indicated in Table 1. The surface electrical resistance of each example was measured.

The measurement results of Example 1 and Comparative Examples 1 and 2 are shown in Table 1. Further, the measurement results of Example 1 and Comparative Examples 1 and 2 in Table 1 are shown in graphs of FIG. 3, FIG. 4 and FIG. 5, respectively.

Figure 3:
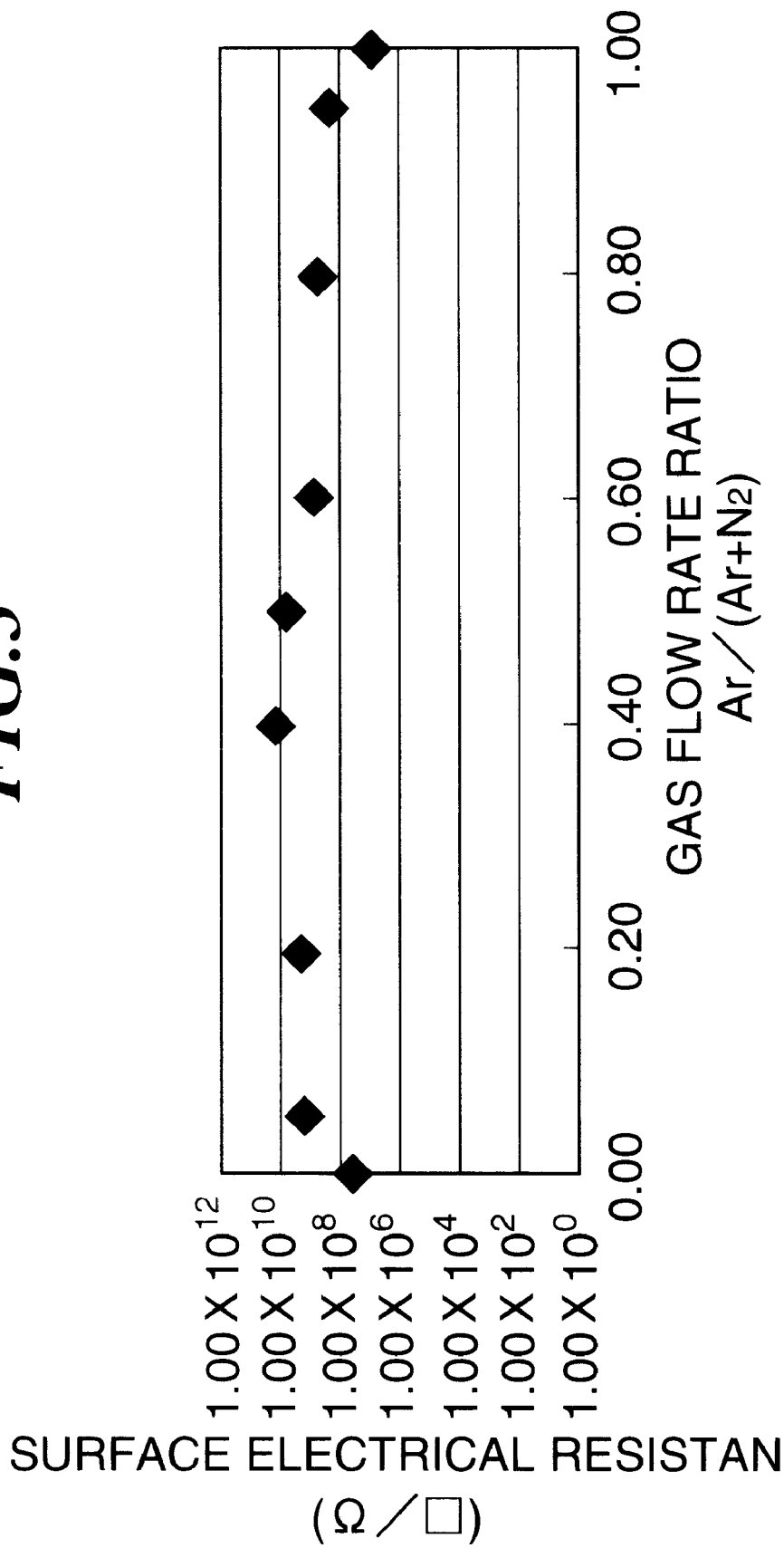
FIG. 3 is a graph showing the surface electrical resistance of the thin film 11 in Example 1.

According to FIG. 3, when sputtering is conducted in an argon-nitrogen mixture gas atmosphere using a $Nb_2O_5$—$TiO_2$ target as in Example 1, insofar as the gas flow rate ratio (A/(A+B)) varies from 5 to 95 volume % (in the case of nitrogen gas, insofar as the gas flow rate ratio (B/(A+B)) varies from 95 to 5 volume %), the surface electrical resistance of the thin film 11 falls steadily within $1.0×10^8$ to $1.0×10^{12}$ $\Omega/\square$. However, when the gas flow ratio rate is less than 5 volume % or above 95 volume %, the surface electrical resistance of the thin film 11 falls below $1.0×10^8$ $\Omega/\square$.

Thus, it can be seen from FIG. 3 that when the gas flow rate ratio (A/(A+B)) is within the range of 5 to 95 volume %, it is possible to obtain a thin film 11 having a surface electrical resistance of $1.0×10^8$ to $1.0×10^{12}$ $\Omega/\square$.

Figure 4:
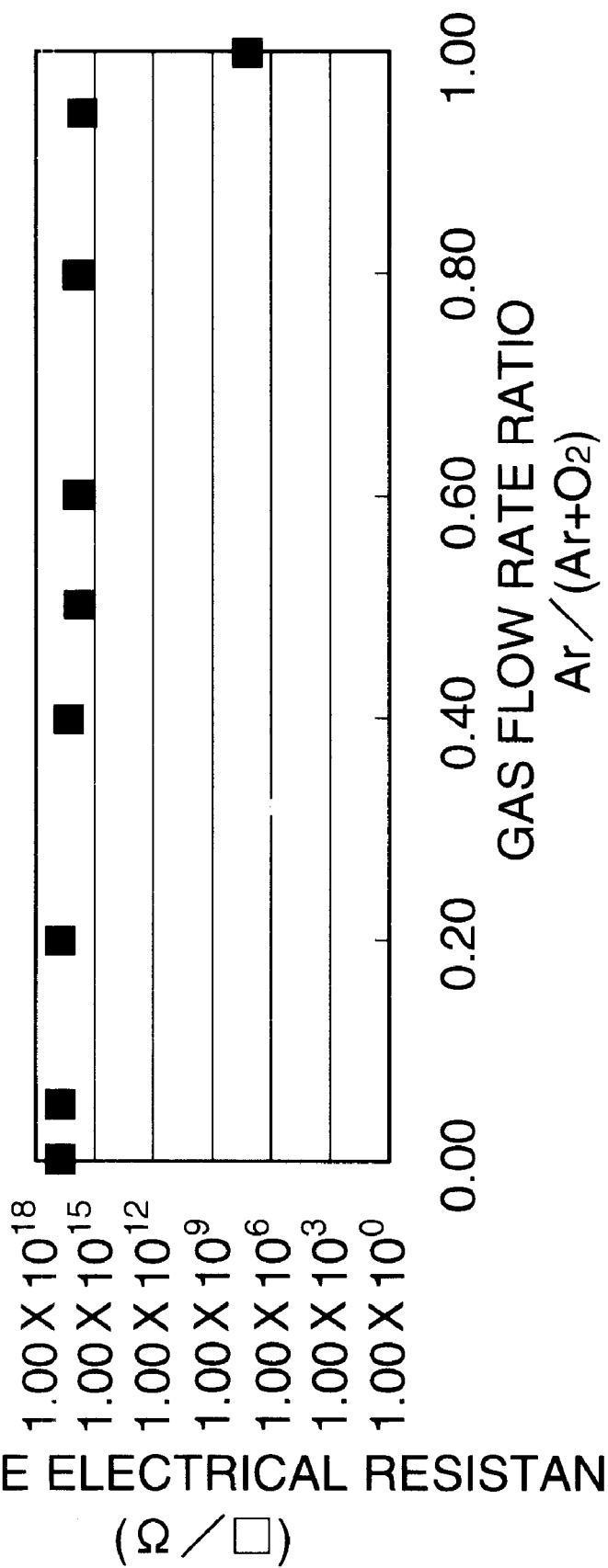
FIG. 4 is a graph showing the surface electrical resistance of the thin film 11 in Comparative Example 1.
Figure 5:
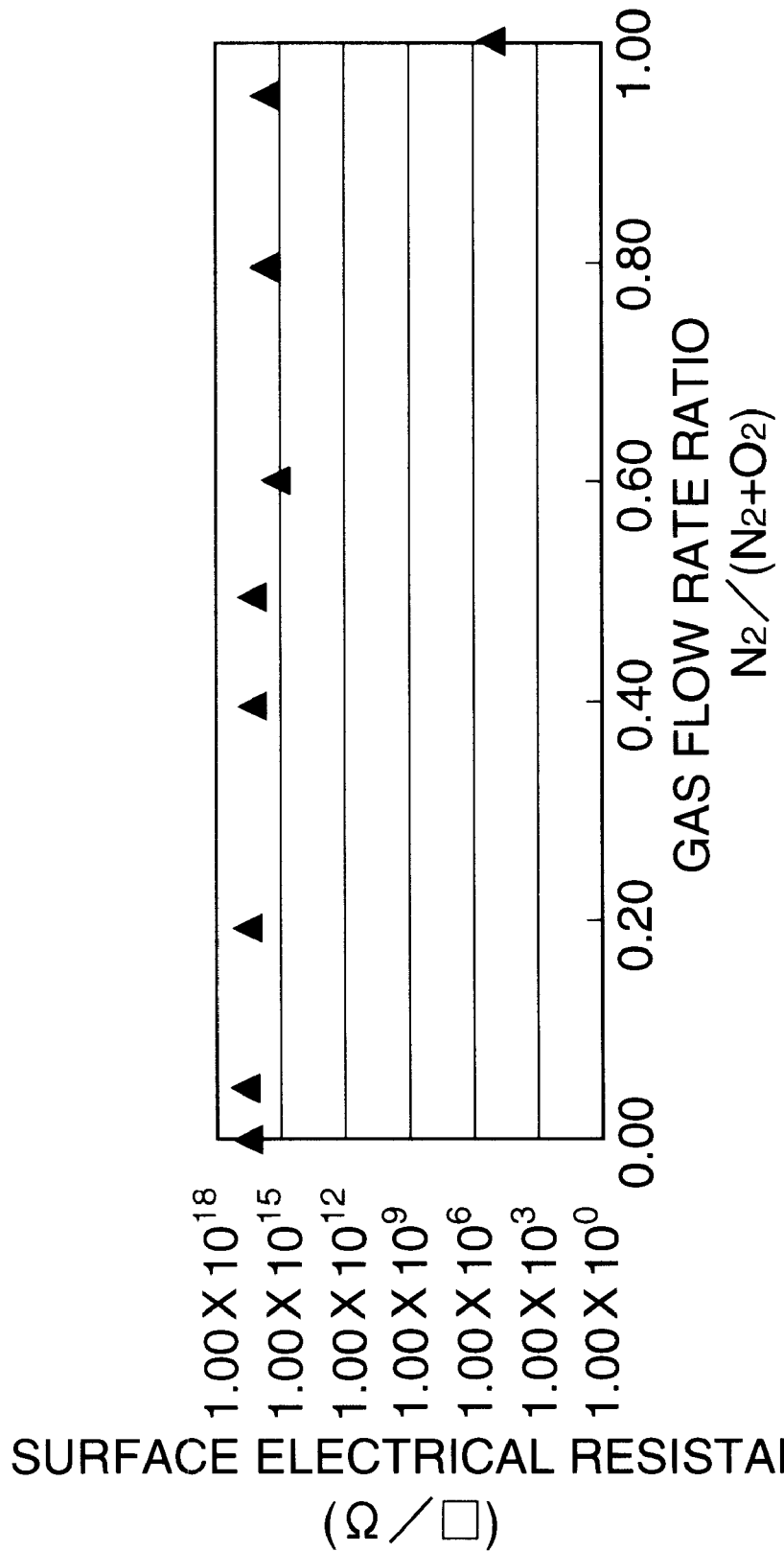
FIG. 5 is a graph showing the surface electrical resistance of the thin film 11 in Comparative Example 2.

Further, it can be seen from FIG. 4 and FIG. 5 that when sputtering is conducted in an argon-oxygen mixture gas atmosphere using a $Nb_2O_5$—$TiO_2$ target, as in Comparative Example 1, and when sputtering is conducted in a nitrogen-oxygen mixture gas atmosphere using a Ti target, as in Comparative Example 2, it is not possible to keep the surface electrical resistance within $1.0×10^8$ to $1.0×10^{12}$ $\Omega/\square$, irrespective of the gas flow rate ratio.

According to the above experiments, while a metal, oxygen, and nitrogen are needed to generate a metal oxynitride, Example 1, in which the metal and oxygen are supplied from the target and nitrogen is supplied from the mixture gas atmosphere, is able to obtain good results of the value of surface electrical resistance of the thin film 11, whereas, Comparative Example 1, in which the metal and oxygen are supplied from the target, but nitrogen is not supplied from the mixture gas atmosphere, and Comparative Example 2, in which the metal is supplied from the target, but neither nitrogen nor oxygen is supplied from the mixture gas atmosphere, are not able to obtain satisfactory surface electrical resistance values.

Further, it can be understood that in Example 1 according to the present invention, the rate of change of the surface electrical resistance of the thin film 11 is gentle compared with the rate of change of the gas flow rate ratio between argon and oxygen in the mixture gas atmosphere. Therefore, a desired surface resistance value of the thin film 11 can be obtained simply by adjusting the flow rate ratio (mixing ratio of argon and oxygen) as a parameter.

On the other hand, in Comparative Example 1 and Comparative Example 2, as the gas flow rate ratio (A/(A+B)) was changed from 95 volume % to 100 volume %, the surface electrical resistance of the thin film 11 changed drastically, which made it impossible to steadily keep the surface electrical resistance of the thin film within the range of $1.0×10^8$ to $1.0×10^{12}$ $\Omega/\square$ in a reliable manner (FIG. 4 and FIG. 5).

Table 2 shows measurement results of the surface electrical resistance of thin films 11 prepared according to Example 1 and Comparative Example 2. In Example 1, ten thin films 11, each having a thickness of 10 nm, were formed by sputtering using a $Nb_2O_5$—$TiO_2$ target in an argon-oxygen mixture gas atmosphere with the gas flow rate ratio at 95 volume %. In Comparative Example 2, ten thin films 11, each having a thickness of 10 nm, were formed by sputtering using a Ti target in an oxygen-nitrogen mixture gas atmosphere with the gas flow rate ratio at 95 volume %.

TABLE 2

|  | EXAMPLE ACCORDING TO PRESENT INVENTION 1 | COMPARATIVE EXAMPLE 2 |
| --- | --- | --- |
| TARGET | $Nb_2O_5$—$TiO_2$ | Ti |
| GAS ATMOSPHERE | A: Ar, B: $N_2$ | A: $O_2$, B: $N_2$ |
| SURFACE ELECTRICAL | $7.65 × 10^9$ | $5.82 × 10^{14}$ |
| RESISTANCE | $1.00 × 10^9$ | $1.16 × 10^{15}$ |
| ($\Omega/\square$) | $3.00 × 10^9$ | $1.25 × 10^6$ |
|  | $5.00 × 10^9$ | $6.52 × 10^{11}$ |
|  | $2.90 × 10^9$ | $6.52 × 10^5$ |
|  | $2.30 × 10^9$ | $5.82 × 10^4$ |
|  | $2.10 × 10^9$ | $5.82 × 10^{14}$ |
|  | $5.00 × 10^9$ | $1.16 × 10^{15}$ |
|  | $1.70 × 10^9$ | $1.75 × 10^{15}$ |
|  | $1.90 × 10^9$ | $2.33 × 10^{15}$ |
| AVERAGE ($\Omega/\square$) | $3.25 × 10^9$ | $7.56 × 10^{14}$ |
| STANDARD DEVIATION ($\Omega/\square$) | $2.03 × 10^9$ | $8.25 × 10^{14}$ |

It can be seen from Table 2 that while the thin films 11 according to Example 1 show substantially constant values of the surface electrical resistance, the thin films 11 according to Comparative Example 2, of which the nitrogen gas atmosphere contains just 5 volume % of oxygen gas, show drastic changes in surface electrical resistance between them.

Next, as Examples 2 to 5, a $V_2O_5$—$TiO_2$ target (containing 0.5 weight % of $V_2O_5$), a $WO_3$—$TiO_2$ target (containing 5 weight % of $WO_3$), a $Y_2O_3$—$TiO_2$ target (containing 10 weight % of $Y_2O_3$), and a $Ta_2O_5$—$TiO_2$ target (containing 8 weight % of $Ta_2O_5$) were used, respectively. These targets were each subjected to sputtering in an argon-nitrogen mixture gas atmosphere while altering the gas flow rate ratio between 0 to 100%, to thereby form thin films 11 on substrates 10. The surface electrical resistance of each of the thin films 11 was measured and the results are shown in Table 3.

TABLE 3

| | | | EXAMPLES ACCORDING TO PRESENT INVENTION | | | | | | |
|---|---|---|---|---|---|---|---|---|---|
| | TARGET | | 2 V$_2$O$_5$—TiO$_2$ | | 3 WO$_3$—TiO$_2$ | | 4 Y$_2$O$_3$—TiO$_2$ | | 5 Ya$_2$O$_5$—TiO$_2$ |
| GAS FLOW RATE A (SCCM) | GAS FLOW RATE B (SCCM) | GAS FLOW RATE RATIO A/(A + B) | SURFACE ELECTRICAL RESISTANCE (Ω/□) A: Ar, B: N$_2$ | EVAL-UATION | SURFACE ELECTRICAL RESISTANCE (Ω/□) A: Ar, B: N$_2$ | EVAL-UATION | SURFACE ELECTRICAL RESISTANCE (Ω/□) A: Ar, B: N$_2$ | EVAL-UATION | SURFACE ELECTRICAL RESISTANCE (Ω/□) A: Ar, B: N$_2$ | EVAL-UATION |
| 0 | 50 | 0.00 | 4.56 × 10$^7$ | x | 1.65 × 10$^7$ | x | 9.89 × 10$^6$ | x | 9.89 × 10$^6$ | x |
| 5 | 45 | 0.10 | 1.79 × 10$^9$ | ○ | 1.42 × 10$^9$ | ○ | 8.52 × 10$^8$ | ○ | 8.52 × 10$^8$ | ○ |
| 10 | 40 | 0.20 | 3.53 × 10$^9$ | ○ | 2.82 × 10$^9$ | ○ | 1.69 × 10$^9$ | ○ | 1.69 × 10$^9$ | ○ |
| 20 | 30 | 0.40 | 1.99 × 10$^{10}$ | ○ | 1.59 × 10$^{10}$ | ○ | 9.56 × 10$^9$ | ○ | 5.73 × 10$^9$ | ○ |
| 25 | 25 | 0.50 | 9.18 × 10$^9$ | ○ | 5.03 × 10$^{10}$ | ○ | 1.02 × 10$^{10}$ | ○ | 6.12 × 10$^9$ | ○ |
| 30 | 20 | 0.60 | 5.40 × 10$^9$ | ○ | 1.03 × 10$^{10}$ | ○ | 6.19 × 10$^9$ | ○ | 6.22 × 10$^9$ | ○ |
| 40 | 10 | 0.80 | 6.00 × 10$^8$ | ○ | 1.08 × 10$^9$ | ○ | 6.48 × 10$^8$ | ○ | 6.12 × 10$^8$ | ○ |
| 45 | 5 | 0.90 | 3.05 × 10$^8$ | ○ | 5.43 × 10$^8$ | ○ | 3.26 × 10$^8$ | ○ | 3.07 × 10$^8$ | ○ |
| 50 | 0 | 1.00 | 9.00 × 10$^6$ | x | 5.70 × 10$^6$ | x | 3.42 × 10$^6$ | x | 2.05 × 10$^6$ | x |

It can be seen from Table 3 that in all Examples 2 to 5, as the gas flow rate ratio varies from 5 to 95 volume % (in the case of the nitrogen gas, as the gas flow rate ratio varies from 95 to 5 volume %), the surface electrical resistance of the thin film 11 is steadily kept within the range of 1.0×10$^8$ to 1.0×10$^{12}$ Ω/□ in a reliable manner. On the other hand, when the gas flow rate ratio is below 5 volume % or above 95 volume %, the surface electrical resistance falls below 1.0×10$^8$ Ω/□.

In Examples 1 to 5 in Tables 1 and 3, when the metal oxides constituting components other than the main component of the target (Nb$_2$O$_5$, V$_2$O$_5$, WO$_3$, Y$_2$O$_3$, and Ta$_2$O$_5$) are contained in a range of 0.5 to 10 weight %, in other words, when the metal oxide (TiO$_2$) which constitutes the main component of the target is contained in a range of 90 to 99.5 weight %, the value of the surface electrical resistance of the thin film 11 is controlled to a desired range.

Table 4 shows measurements results of the surface electrical resistance of thin films 11 prepared by sputtering in an argon-nitrogen mixture gas atmosphere using a Nb$_2$O$_5$—TiO$_2$ target (as in Example 1), with the thickness of the film being set to 10, 30, 50, and 100 nm. The measurement results of Table 4 are shown in a graph of FIG. 6.

to the film thickness of the thin film 11, basically a thin film is preferable in terms of the manufacturing cost, and the film thickness may be adjusted appropriately to a desired thickness.

What is claimed is:

1. A method of manufacturing a substrate for displays, comprising the steps of:
   preparing a target from a metal oxide; and
   forming a thin film of a metal oxynitride on a surface of the substrate by sputtering using said target in an atmosphere of a mixture gas of an inert gas and nitrogen, a mixing ratio of said inert gas and nitrogen in said atmosphere being adjusted such that said thin film has a desired surface electrical resistance.

2. A method as claimed in claim 1, wherein said inert gas is contained in said atmosphere in an amount of 5 to 95 volume %.

3. A method as claimed in claim 1, wherein said desired surface electrical resistance is 1.0×10$^8$ to 1.0×10$^{12}$ Ω/□.

4. A method as claimed in any of claims 1, wherein said target is formed of at least two kinds of metal oxides.

5. A method as claimed in claim 4, wherein one kind of said two kinds of metal oxides is an oxide of an element selected from the group consisting of titanium and zirconium.

TABLE 4

| GAS FLOW RATE RATIO A/(A + B) | SURFACE ELECTRICAL RESISTANCE (Ω/□) | | | |
|---|---|---|---|---|
| | FILM THICKNESS 10 nm | FILM THICKNESS 30 nm | FILM THICKNESS 50 nm | FILM THICKNESS 100 nm |
| 0.00 | 3.80 × 10$^7$ | 1.27 × 10$^7$ | 7.60 × 10$^6$ | 3.80 × 10$^6$ |
| 0.05 | 1.49 × 10$^9$ | 4.97 × 10$^8$ | 2.98 × 10$^8$ | 1.49 × 10$^8$ |
| 0.20 | 2.94 × 10$^9$ | 9.81 × 10$^8$ | 5.88 × 10$^8$ | 2.94 × 10$^8$ |
| 0.40 | 1.66 × 10$^{10}$ | 5.53 × 10$^9$ | 3.32 × 10$^9$ | 1.66 × 10$^9$ |
| 0.50 | 7.65 × 10$^9$ | 2.55 × 10$^9$ | 1.53 × 10$^9$ | 7.65 × 10$^8$ |
| 0.60 | 1.00 × 10$^9$ | 3.33 × 10$^8$ | 2.00 × 10$^8$ | 1.00 × 10$^8$ |
| 0.80 | 5.00 × 10$^8$ | 1.67 × 10$^8$ | 1.00 × 10$^8$ | 5.00 × 10$^7$ |
| 0.95 | 2.54 × 10$^8$ | 8.47 × 10$^7$ | 5.08 × 10$^7$ | 2.54 × 10$^7$ |
| 1.00 | 8.00 × 10$^6$ | 2.67 × 10$^6$ | 1.60 × 10$^6$ | 8.00 × 10$^5$ |

Figure 6:
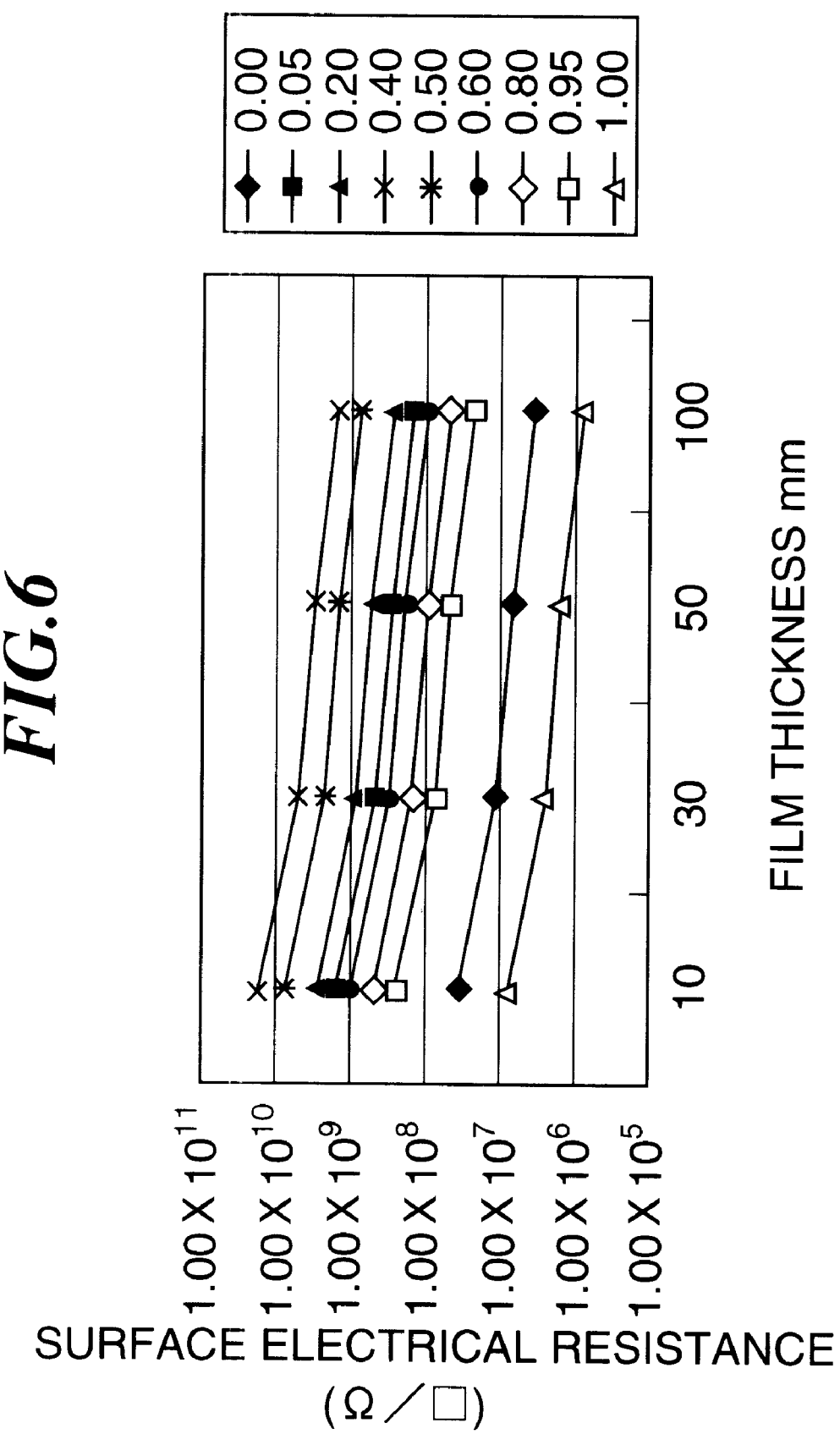
FIG. 6 is a graph showing the surface electrical resistance of a thin film 11 identical with the thin film 11 in Example 1 but with different film thickness values.

It can be seen from FIG. 6 that there is no significant change in the surface electrical resistance even when the thickness of the thin film 11 increases, and that in examples being low in surface electrical resistance, the surface electrical resistance increases when the film thickness of the thin film 11 is reduced. Further, although there is no specific limit 6. A method as claimed in claim 5, wherein the other kind of said two kinds of metal oxides is an oxide of an element selected from the group consisting of niobium, vanadium, tantalum, yttrium, and tungsten.

7. A method as claimed in claim 5, wherein said one kind of said two kinds of metal oxides is contained in said target in an amount of 70 to 99.5 weight %.

8. A method as claimed in claim 6, wherein the other kind of said two kinds of metal oxides is contained in said target in an amount of 0.5 to 30 weight %.

9. A method as claimed in any of claims 1, further comprising the step of forming at least one anti-movable ion thermodiffusion film stacked on said thin film formed on the surface of said substrate.

10. A method as claimed in claim 9, wherein said anti-movable ion thermodiffusion film is formed of a compound selected from the group consisting of an oxide of silicon, an oxynitride of silicon, or a nitride of silicon.

11. A method as claimed in claim 9, wherein said anti-movable ion thermodiffusion film has a total film thickness of 20 to 1000 nm.

12. A substrate for displays manufactured by preparing a target from a metal oxide, and forming a thin film of a metal oxynitride on a surface of the substrate by sputtering using said target in an atmosphere of a mixture gas of an inert gas and nitrogen, a mixing ratio of said inert gas and nitrogen in said atmosphere being adjusted such that said thin film has a desired surface electrical resistance.

13. A substrate for displays as claimed in claim 12, wherein said inert gas is contained in said atmosphere in an amount of 5 to 95 volume %.

14. A substrate for displays as claimed in claim 12, wherein said desired surface electrical resistance is $1.0 \times 10^8$ to $1.0 \times 10^{12}$ $\Omega/\square$.

15. A substrate for displays as claimed in any of claims 12, wherein said target is formed of at least two kinds of metal oxides.

16. A substrate for displays as claimed in claim 15, wherein one kind of said two kinds of metal oxides is an oxide of an element selected from the group consisting of titanium and zirconium.

17. A substrate for displays as claimed in claim 16, wherein the other kind of said two kinds of metal oxides is an oxide of an element selected from the group consisting of niobium, vanadium, tantalum, yttrium, and tungsten.

18. A substrate for displays as claimed in claim 16, wherein said one kind of said two kinds of metal oxides is contained in said target in an amount of 70 to 99.5 weight %.

19. A substrate for displays a claimed in claim 17, wherein the other kind of said two kinds of metal oxides is contained in said target in an amount of 0.5 to 30 weight %.

20. A substrate for displays as claimed in claim 12, further comprising at least one anti-movable ion thermodiffusion film stacked on said thin film formed on the surface of said substrate.

21. A substrate for displays as claimed in claim 20, wherein said anti-movable ion thermodiffusion film is formed of a compound selected from the group consisting of an oxide of silicon, an oxynitride of silicon, or a nitride of silicon.

22. A substrate for displays as claimed in claim 20, wherein said anti-movable ion thermodiffusion film has a total film thickness of 20 to 1000 nm.

23. A method of manufacturing a field emission element on a substrate comprising:

preparing a target from a metal oxide;

forming a thin film of a metal oxynitride on a surface of the substrate by sputtering using said target in an atmosphere of a mixture gas of an inert gas and nitrogen, a mixing ratio of said inert gas and nitrogen in said atmosphere being adjusted such that said thin film has a desired surface electrical resistance;

forming a pair of conductive element electrodes on the thin film;

forming a conductive film on the thin film between the element electrodes and partially overlapping the electrodes so that the electrodes are electrically connected with each other;

forming and electron emitting part having a higher electrical resistance than the conductive film in a part of the conductive film; and coating the electron emitting part and its neighboring area with a thin film of carbon or a carbon compound.

24. A method as claimed in claim 23, wherein said inert gas is contained in said atmosphere in an amount of 5 to 95 volume %.

25. A method as claimed in claim 23, wherein said desired surface electrical resistance is $1.0 \times 10^8$ to $1.0 \times 10^{12}$ $\Omega/\square$.

26. A method as claimed in claim 23, wherein said target is formed of at least two kinds of metal oxides.

27. A method as claimed in claim 26, wherein one kind of said two kinds of metal oxides is an oxide of an element selected from the group consisting of titanium and zirconium.

28. A method as claimed in claim 27, wherein an other kind of said two kinds of metal oxides is an oxide of an element selected from the group consisting of niobium, vanadium, tantalum, yttrium, and tungsten.

29. A method as claimed in claim 27, wherein said one kind of said two kinds of metal oxides is contained in said target in an amount of 70 to 99.5 weight %.

30. A method as claimed in claim 28, wherein the other kind of said two kinds of metal oxides is contained in said target in an amount of 0.5 to 30 weight %.

31. A method as claimed in claim 23, further comprising the step of forming at least one anti-movable ion thermodiffuision film stacked on said thin film formed on the surface of said substrate.

32. A method as claimed in claim 31, wherein said anti-movable ion thermodiffuision film is formed of a compound selected from the group consisting of an oxide of silicon, an oxynitride of silicon, or a nitride of silicon.

33. A method as claimed in claim 31, wherein said anti-movable ion thermodiffuision film has a total film thickness of 20 to 1000 nm.

34. A field emission element on a substrate comprising:

a thin film of a metal oxynitride on a surface of the substrate having a desired surface electrical resistance;

a pair of conductive element electrodes on the thin film;

a conductive film on the thin film between the element electrodes and partially overlapping the electrodes so that the electrodes are electrically connected with each other;

an electron emitting part having a higher electrical resistance than the conductive film in a part of the conductive film; and a thin film of carbon or a carbon compound which coats the electron emitting part and its neighboring area;

wherein the thin film of a metal oxynitride is formed on a surface of the substrate by sputtering using said target in an atmosphere of a mixture gas of an inert gas and nitrogen; and wherein a mixing ratio of said inert gas and nitrogen in said atmosphere is adjusted such that said thin film has the desired surface electrical resistance.

35. A field emission element on a substrate as claimed in claim 34, wherein said inert gas is contained in said atmosphere in an amount of 5 to 95 volume %.

36. A field emission element on a substrate as claimed in claim 34, wherein said desired surface electrical resistance is $1.0 \times 10^8$ to $1.0 \times 10^{12}$ $\Omega/\square$.

37. A field emission element on a substrate as claimed claim 34, wherein said target is formed of at least two kinds of metal oxides.

38. A field emission element on a substrate as claimed in claim 37, wherein one kind of said two kinds of metal oxides is an oxide of an element selected from the group consisting of titanium and zirconium.

39. A field emission element on a substrate as claimed in claim 38, wherein an other kind of said two kinds of metal oxides is an oxide of an element selected from the group consisting of niobium, vanadium, tantalum, yttrium, and tungsten.

40. A field emission element on a substrate as claimed in claim 38, wherein said one kind of said two kinds of metal oxides is contained in said target in an amount of 70 to 99.5 weight %.

41. A field emission element on a substrate as claimed in claim 37, wherein the other kind of said two kinds of metal oxides is contained in said target in an amount of 0.5 to 30 weight %.

42. A field emission element on a substrate as claimed in claim 34, further comprising at least one anti-movable ion thermodiffusion film stacked on said thin film formed on the surface of said substrate.

43. A field emission element on a substrate as claimed in claim 42, wherein said anti-movable ion thermodiffusion film is formed of a compound selected from the group consisting of an oxide of silicon, an oxynitride of silicon, or a nitride of silicon.

44. A field emission element on a substrate as claimed in claim 42, wherein said anti-movable ion thermodiffusion film has a total film thickness of 20 to 1000 nm.

* * * * *